United States Patent
Reber et al.

(10) Patent No.: US 11,519,094 B2
(45) Date of Patent: Dec. 6, 2022

(54) APPARATUS AND METHOD FOR ETCHING ONE SIDE OF A SEMICONDUCTOR LAYER OF A WORKPIECE

(71) Applicant: NexWafe GmbH, Freiburg (DE)

(72) Inventors: Stefan Reber, Gundelfingen (DE); Kai Schillinger, Freiburg (DE); Benjamin Reichhart, Emmendingen-Wasser (DE); Nena Milenkovic, Reute (DE)

(73) Assignee: NexWafe GmbH, Freiburg (DE)

( * ) Notice: Subject to any disclaimer, the term of this patent is extended or adjusted under 35 U.S.C. 154(b) by 0 days.

(21) Appl. No.: 17/049,729

(22) PCT Filed: May 6, 2019

(86) PCT No.: PCT/EP2019/061548
§ 371 (c)(1),
(2) Date: Oct. 22, 2020

(87) PCT Pub. No.: WO2019/219430
PCT Pub. Date: Nov. 21, 2019

(65) Prior Publication Data
US 2021/0246546 A1    Aug. 12, 2021

(30) Foreign Application Priority Data

May 17, 2018    (DE) .......................... 102018111858.9

(51) Int. Cl.
*C25F 7/00*    (2006.01)
*H01L 21/683*    (2006.01)
(Continued)

(52) U.S. Cl.
CPC .............. *C25F 7/00* (2013.01); *C25D 17/001* (2013.01); *H01L 21/3063* (2013.01);
(Continued)

(58) Field of Classification Search
CPC .......... C25F 3/12; C25F 7/00; H01L 21/3063; H01L 21/30635; H01L 21/6838; C25D 17/001
See application file for complete search history.

(56) References Cited

U.S. PATENT DOCUMENTS

| 5,000,827 A | 3/1991 | Schuster et al. |
| 5,338,416 A * | 8/1994 | Mlcak ....................... C25F 3/12 |
| | | 438/746 |

(Continued)

FOREIGN PATENT DOCUMENTS

| DE | 102007020499 | 6/2008 |
| DE | 102013219886 | 4/2015 |

(Continued)

*Primary Examiner* — Nicholas A Smith
(74) *Attorney, Agent, or Firm* — Volpe Koenig (57) ABSTRACT

An apparatus for etching one side of a semiconductor layer of a workpiece, including at least one etching basin for receiving an electrolyte, a first electrode which is provided for electrically contacting the electrolyte located in the etching basin, a second electrode which is provided for electrically contacting the semiconductor layer, a electrical power source which is electrically conductively connected to the first and the second electrodes for generating an etching current, and a transport apparatus for transporting the workpiece relative to the etching basin such that a semiconductor layer etching face to be etched can be wetted by the electrolyte in the etching basin. The transport apparatus has a negative pressure holding element for the workpiece, designed to position the workpiece on a retaining face of the workpiece opposite to the etching face by negative pressure, and the second electrode is positioned on the negative pressure holding element such that, when the workpiece is positioned on the negative pressure holding element, the retaining face of the workpiece is contacted by (Continued)

the second electrode. A method for etching one side of a semiconductor layer of a workpiece is also provided.

21 Claims, 5 Drawing Sheets

(51) Int. Cl.
  *H01L 21/3063* (2006.01)
  *C25D 17/00* (2006.01)
  *H01L 21/67* (2006.01)
(52) U.S. Cl.
  CPC .... *H01L 21/30635* (2013.01); *H01L 21/6838* (2013.01); *H01L 21/67086* (2013.01)

(56) References Cited

U.S. PATENT DOCUMENTS

| | | |
|---|---|---|
| 2002/0127956 A1 | 9/2002 | Ashjaee et al. |
| 2016/0211154 A1 | 7/2016 | Fraunhoffer-Gesellschaft |
| 2018/0005853 A1* | 1/2018 | Kim .................... C25D 11/32 |
| 2018/0374723 A1 | 12/2018 | Reber et al. |

FOREIGN PATENT DOCUMENTS

| | | |
|---|---|---|
| DE | 102015121636 | 6/2017 |
| JP | H05326488 | 12/1993 |
| JP | 2003017464 | 1/2003 |

* cited by examiner

APPARATUS AND METHOD FOR ETCHING ONE SIDE OF A SEMICONDUCTOR LAYER OF A WORKPIECE

TECHNICAL FIELD

The present invention relates to an apparatus and a method for etching one side of a semiconductor layer of a workpiece.

BACKGROUND

In the processing of semiconductor layers, in particular in the production of large-area semiconductor components, such as for example photovoltaic solar cells, processing of one side of the semiconductor layer by etching is often desirable. For this purpose, the side that is not to be etched may be provided with an etching protecting layer, so that in a subsequent etching operation only the side that is not covered by the protective layer is worked. However, such a procedure is laborious, since the protective layer has to be applied and removed again.

There are therefore known methods in which essentially only the side to be etched of the semiconductor layer is wetted with an electrolyte. By use of a current source, typically a constant current source, an etching current is generated between the electrolyte and the semiconductor layer, so that one-sided etching takes place.

Such methods and apparatuses are known from DE 10 2013 219 886 A1 and DE 10 2015 121 636 A1. They involve the workpiece, which has a semiconductor layer with a side to be etched, being moved by a transporting device over an electrolyte in an etching chamber in such a way that essentially only the side of the semiconductor layer that is facing the electrolyte is wetted with the electrolyte. DE 10 2013 219 886 A1 discloses a method in which a contact unit is used for electrically contacting the workpiece on the surface that is not to be etched by an anode.

The aforementioned methods can already be used in an in-line process. However, for use in industrial production, there is a need to improve the quality of the etching operation. In particular when using the aforementioned one-sided etching methods for porosifying a surface of the semiconductor layer, in order to use the semiconductor layer as a seed carrier for downstream semiconductor wafer production, a high quality, in particular homogeneity, of the etching operation is necessary, even in the in-line process.

SUMMARY

The present invention is therefore based on the object of improving the quality of the previously known one-sided etching methods by electrochemical etching.

This object is achieved by an apparatus according and also by a method having one or more features described herein. Advantageous designs can be found below and in the claims.

The apparatus according to the invention is preferably formed for carrying out the method according to the invention, in particular a preferred embodiment thereof. The method according to the invention is preferably formed for being carried out by the apparatus according to the invention, in particular a preferred embodiment thereof.

The apparatus according to the invention for etching one side of a semiconductor layer of a workpiece has at least one etching basin for receiving an electrolyte for forming an etching bath and also a first electrode, which is arranged for electrically contacting the electrolyte that is located in the etching basin during use, at least one second electrode, which is arranged for indirect or direct electrical contacting of the semiconductor layer, at least one electrical current source, which is connected in an electrically conducting manner to the first and second electrodes for generating an etching current, and at least one transporting device for transporting the workpiece in relation to the etching basin in such a way that only an etching side to be etched of the semiconductor layer can be wetted by the electrolyte that is located in the etching basin during use.

The invention is based on the finding made by the applicant that, in the case of the previously known apparatuses, on the side of the workpiece that is facing away from the electrolyte, either wet-chemical contactings were used, which do allow homogeneous contact with a low transfer resistance with respect to the semiconductor layer, but can only be integrated in a continuous installation with a great amount of effort. In particular, investigations by the applicant show that, when used in a continuous installation with wet-chemical contacting by the second electrode, leakage currents often occur during operation at the edge of the workpiece, leading to an inhomogeneous etching operation. DE 10 2013 219 886 A1 discloses achieving contacting of the second electrode in a continuous installation in a liquid-free manner by a synchronously moving contact or a sliding contact. Investigations by the applicant show that, with such contactings, in conjunction with the transporting belt used, inhomogeneous etching operations can likewise occur.

In the case of the apparatus according to the invention, it is therefore essential that the transporting device has a negative-pressure holding element for the workpiece and the negative-pressure holding element is formed for arranging the workpiece on a holding side of the workpiece opposite from the etching side by negative pressure. Furthermore, the second electrode is arranged on the negative-pressure holding element in such a way that, when a workpiece is arranged on the negative-pressure holding element, contacting of the holding side of the workpiece takes place by the second electrode.

The previously described fault analysis by the applicant with respect to previous apparatuses led to the development of the apparatus according to the invention, in which two major sources of error can be eliminated, or at least their influence reduced, by the negative-pressure holding element: by forming the holding element as a negative-pressure holding element, holding of the workpiece consequently takes place at least essentially, preferably exclusively, by the negative-pressure holding element, and consequently on the holding side of the workpiece opposite from the etching side. In this way, a secure hold can be achieved, without contact of the holding element with the electrolyte. Furthermore, the design of the holding element as a negative-pressure holding element offers the possibility of achieving at the same time by the negative pressure a pressing pressure of the workpiece against the second electrode, and consequently promoting homogeneous contacting. In addition, in the case of the apparatus according to the invention, supporting elements such as for example transporting belts for the workpiece in the electrolyte are not necessary, so that inhomogeneities on the side to be etched due to supporting points on such transporting belts can be avoided.

The apparatus according to the invention consequently makes one-sided electrochemical etching of a semiconductor layer of a workpiece possible in in-line operation, with nevertheless high quality, in particular good homogeneity, of the etching operation on the etching side.

The one-sided etching by the method according to the invention and the apparatus according to the invention is preferably performed by essentially only the side to be etched of the semiconductor layer being wetted with electrolyte. It is within the scope of the invention that the edge region and parts of the side of the workpiece that is facing away from the electrolyte are also bathed with electrolyte, at least for a time. There is however preferably dry contact between the second electrode and the workpiece. Advantageously, the apparatus according to the invention therefore has at least one separating means, in order to prevent contact between the electrolyte and the workpiece, at least in the contact region between the workpiece and the second electrode.

The holding element may have a carrier element, on which the semiconductor layer is arranged. In particular, the carrier element may be electrically conducting, so that the carrier element is electrically contacted by the second electrode. Similarly, additional current conducting elements may be provided, in order to ensure an electrically conducting connection of the second electrode, connected to the current conducting elements, and the semiconductor layer. In typical applications, the workpiece is formed as a one-piece semiconductor layer, for example semiconductor wafer, in particular silicon wafer.

The object mentioned at the beginning is likewise achieved by a method according to the invention for etching one side of a semiconductor layer of a workpiece, the semiconductor layer being wetted with an electrolyte on an etching side to be etched. The electrolyte is electrically contacted by a first electrode and the workpiece is electrically contacted on a side facing away from the electrolyte by a second electrode. An etching current is formed between the electrodes. It is essential that, during the etching operation, the workpiece is held by negative pressure and pressed against the second electrode exclusively on a holding side opposite from the etching side.

This brings about the advantages mentioned in relation to the method according to the invention.

In order to avoid inhomogeneity due to supporting points with holding elements on the etching side, the apparatus is preferably formed so as to hold the workpiece exclusively by the negative-pressure holding element during the etching operation.

Advantageously, the workpiece is pressed against the second electrode by a negative pressure with a pressure in the range of 10 Pa to 50 000 Pa, preferably in the range of 200 Pa to 2000 Pa.

The apparatus according to the invention preferably has a negative pressure source, which is formed as interacting with the negative-pressure holding element, in order to generate a pressing pressure of the workpiece against the second electrode, in particular preferably in the range of 10 Pa to 50 000 Pa, preferably in the range of 200 Pa to 2000 Pa, in order to achieve the aforementioned advantages.

This promotes a secure hold and also good electrical contact. It is in this way ensured in the case of the present invention by the negative-pressure holding element that the workpiece lies with the holding side against the second electrode. It is therefore possible to dispense with laborious wet-chemical types of contacting for the second electrode. Advantageously, therefore, the second electrode makes dry contact with the holding side of the workpiece during the etching operation.

In order to promote a homogeneous etching operation, the workpiece is preferably contacted in an electrically conducting manner on the holding side by the second electrode over a large surface area. Advantageously, the second electrode therefore contacts during the etching operation a surface area in the range of 100 cm$^2$ to 2 m$^2$, in particular 150 cm$^2$ to 1600 cm$^2$ of the holding side of the workpiece, in the case of typical workpiece dimensions of 15.7 cm×15.7 cm.

The apparatus according to the invention therefore preferably has a second electrode formed as a flat electrode. In particular, it is advantageous that the second electrode is formed for covering a surface area of at least 100 cm$^2$, in particular at least 150 cm$^2$, more preferably at least 200 cm$^2$, of the holding side of the workpiece. In this way, the aforementioned advantages are achieved.

As described above, it is not necessary in the case of the present invention to provide a transporting system on the etching side. In particular, a conveyor belt system known from the prior art, which is located in the electrolyte close to the surface of the electrolyte, is not necessary.

It is however advantageous to provide a safety transporting system in the electrolyte, so as to ensure in the event of a malfunction in which the workpiece inadvertently becomes detached from the negative-pressure holding element, in particular in which the workpiece breaks, transporting away of the workpiece or of parts of the workpiece.

Advantageously, the apparatus therefore has a safety transporting system, which in particular preferably comprises at least one catching element. The safety transporting system is in this case advantageously formed so as to move the catching element in the electrolyte synchronously with the negative-pressure holding element during the etching operation. In the case of this advantageous embodiment, it is consequently ensured that a workpiece that becomes detached, or parts thereof, in the case of a fault do not stay in the electrolyte but can be transported away, and for example discharged into a scrap container, by the safety transporting system.

The safety transporting system may be formed in a way known per se as a conveyor belt. Preferably, the safety transporting system is formed in such a way that there is no contact between the workpiece and the catching element during the etching operation, in particular when the workpiece is undamaged. In this way, consequently, generally inhomogeneity of the etching operation due to supporting points on the etching side in the electrolyte is ruled out. In addition, it is however ensured in the event of a fault that the workpiece or a fragment thereof comes into contact with the safety transporting system and is transported away as described above.

The safety transporting system is consequently preferably formed to transport away a workpiece falling off from the negative-pressure holding element, or parts thereof, out of the electrolyte.

In an advantageous embodiment, the safety transporting system is formed to convey a fallen-off workpiece or fragments thereof synchronously with the movement of the negative-pressure holding element. This brings about the advantage that the risk of the fallen-off workpiece or fragments thereof interacting with preceding or following negative-pressure holding elements is reduced.

It is similarly within the scope of the invention that the safety transporting system is formed for transport counter to the transporting direction of the workpiece by the lifting element or obliquely or perpendicularly thereto.

The safety transporting system preferably comprises at least one chain, roller and/or net.

In a preferred embodiment, the safety transporting system has at least one catching element, in particular a catching basket or a catching net, which preferably covers at least the surface area of the workpiece. In this way it is ensured that, even in the event of the workpiece breaking, the fragments are transported away by the safety transporting system. Preferably, the safety transporting system has a catching element for the workpiece and/or fragments of the workpiece.

The safety transporting system is arranged at least with the elements that transport the workpiece or fragments thereof preferably below the surface of the electrolyte, preferably at a distance of at least 3 mm, in particular at least 5 mm, preferably at least 1 cm, from the surface of the electrolyte.

The catching elements preferably move in the electrolyte below the surface of the electrolyte, preferably at a distance of at least 3 mm, in particular at least 5 mm, preferably at least 1 cm, from the surface of the electrolyte.

Investigations by the applicant have shown that inhomogeneous flows at the edge of the workpiece between the wet-chemical contact on the etching side of the semiconductor layer and the dry contact by the second electrode on the holding side of the workpiece are a further reason for inhomogeneous etching results. Advantageously, the surface area covered by the second electrode is therefore chosen to be smaller than the surface area to be etched, that is to say the surface area of the etching side of the semiconductor layer. In particular, it is advantageous that the second electrode is arranged at a distance from the edge on the holding side of the workpiece, in particular at a peripheral distance from the edge. Preferably, the second electrode therefore contacts the holding side of the workpiece at a distance from the edge in the range of 5 mm to 20 mm from the edge of the workpiece, in particular from the edge of the holding side, in particular preferably at a peripheral distance from the edge, preferably in the stated range.

Investigations by the applicant show that the construction of the second electrode described below is particularly advantageous:

Preferably, the second electrode has a metallic or graphitic current supplying element, a metal-free current distributing element or current distributing structure and a contact-forming structure, which are arranged in such a way that, when a workpiece is arranged on the negative-pressure holding element, the holding side of the workpiece lies against the contact-forming structure and that the contact-forming structure is connected in an electrically conducting manner to the metallic current supplying element by way of the metal-free current distributing element.

The use of a metal-free current distributing element interposed between the current supplying element and the contact-forming structure has the advantage that an influx of metallic impurities harmful to the process can be significantly reduced. In the typical embodiment, the electrolyte used consists of corrosive media, in particular acids, typically hydrofluoric acid, which attack metallic structures, in particular also their vapors above the etching bath. This corrosion caused in this way can lead to contamination of the etching bath, which can be avoided by the construction described above.

The metal-free current distributing element is therefore preferably formed in such a way that the metal-free current distributing element covers in an electrically conducting manner at least 80%, in particular at least 95%, of the surface area of the contact-forming structure that is assigned to the current distributing element. In particular, the surface area forming the electrical contact between the current distributing element and the contact-forming structure has at least a size of at least 100 cm$^2$, in particular at least 200 cm$^2$, preferably at least 250 cm$^2$.

The contact-forming structure can in turn be optimized to form a homogeneous and large-area electrically conducting contact on the holding side of the workpiece. In particular, the contact-forming structure is preferably formed according to one of the advantageous embodiments mentioned hereafter: as a rigid plate, as a soft conductive woven fabric, as a preferably regularly arranged array of locally contacting contact elements, as an element spring-mounted on the negative-pressure holding element and/or with a structured contact side for lying against the holding side of the workpiece.

In particular, a preferred embodiment with a structured side of the contact-forming structure that is facing the workpiece has proven to be advantageous, preferably a pin structure, pyramid tips, a hemispherical facing, a roughened, for example sandblasted, surface, etc. This structuring is suitable in particular for improving the electrical contact when there are unevennesses of the rear side of the workpiece, for example caused by particles.

A robust construction is obtained in an advantageous design in which at least the contact-forming structure and current distributing element are formed in one piece, preferably monolithically. In particular, the use of a plate, preferably a graphite plate, as a contact-forming structure and current distributing element is advantageous.

Advantageously, the contact-forming structure has negative-pressure distributing channels, which on the one hand can be connected to a negative pressure source and on the other hand have at least one opening, preferably a plurality of openings, on the side facing the workpiece.

As previously mentioned, the one-sided etching is preferably performed by the method according to the invention and the apparatus according to the invention by essentially only the side to be etched of the semiconductor layer being wetted with electrolyte. In particular, contacting of the workpiece by the second electrode preferably takes place in such a way that no electrolyte penetrates into the contact surface between the second electrode and the workpiece. Consequently, dry contacting of the workpiece by the second electrode preferably takes place.

The negative-pressure holding element therefore preferably has at least one sealing element, in order to prevent penetration of electrolyte into the contact surface between the second electrode and the workpiece when a workpiece is arranged on the negative-pressure holding element. The sealing element is therefore preferably formed in such a way that, when a workpiece is arranged on the negative-pressure holding element, the sealing element lies against the workpiece and encloses the contact surface, preferably encloses it completely. The sealing element is preferably formed peripherally around a contact surface of the second electrode for contacting the workpiece.

The sealing element may be formed as a seal known per se, in particular as a sealing ring. However, such sealing rings have the disadvantage that there are great demands on the material, the sealing rings are therefore subject to wear and/or cause high material costs.

In an advantageous embodiment, the negative-pressure holding element has a barrier gas device. The barrier gas device is formed to prevent penetration of electrolyte into the contact surface between the second electrode and the workpiece by a barrier gas, or at least to reduce the risk of such penetration. In this advantageous embodiment, the barrier gas device consequently represents a sealing element.

In the case of the method according to the invention, the flushing with a barrier gas of an edge region of the side of the second electrode that is facing the workpiece, in particular preferably a peripheral edge region, takes place, preferably at least during the etching operation, in order to avoid contact of electrolyte with the second electrode, or at least to reduce this risk. Ambient air may be used as the barrier gas. Similarly, the use of inert gases and/or noble gases, in particular nitrogen and/or argon, is within the scope of the invention.

The barrier gas device preferably has a barrier gas distributor channel for distributing the barrier gas from a barrier-gas supply connection to a plurality of barrier-gas discharge openings. The barrier-gas discharge openings are preferably distributed around the edge of the second electrode on the side facing the workpiece. It is similarly within the scope of the invention that the barrier gas device has distributor channels for the barrier gas.

Electrically high-quality and homogeneous contacting between the second electrode and the workpiece is highly relevant for achieving a homogeneous etching result. Advantageously, the apparatus according to the invention therefore has a flushing gas device for flushing off the contact surface between the workpiece and the second electrode before and/or during the sucking-into-place operation and/or the etching operation. The flushing gas device consequently makes blowing off of the contact surface of the second electrode possible before the workpiece is sucked into place. Similarly, possibly disadvantageous contact after the workpiece has been sucked into place, in particular during the etching operation, can be corrected, preferably by flushing gas briefly being blown at least into partial regions between the workpiece and the second electrode by a surge of flushing gas. Because the holding element is formed as a negative-pressure holding element, the flushing gas is sucked away again by the negative pressure source. Preferably, the negative-pressure holding element has on the side facing the workpiece at least one flushing-gas outlet opening, preferably a plurality of flushing-gas outlet openings, which is/are connected in a fluid-conducting manner to a flushing-gas supply inlet, in order to supply flushing gas between the workpiece and the negative-pressure holding element via the flushing-gas supply inlet.

The flushing is consequently preferably performed by supplying flushing gas by the flushing gas device, in particular via the flushing-gas outlet openings. In an advantageous design of the method according to the invention, for the flushing, flushing gas is supplied both via the flushing-gas outlet openings and via the previously described barrier gas device.

Ambient air may be used as the flushing gas. Similarly, the use of inert gases and/or noble gases, in particular nitrogen and/or argon, is within the scope of the invention.

By use of the method according to the invention and the apparatus according to the invention it is advantageously possible in particular for porosifying of the semiconductor layer on the etching side to be performed, in particular as described in DE 10 2013 219 886 A1.

The apparatus according to the invention preferably has a plurality of negative-pressure holding elements, which are moved at the same time, preferably at a specified, constant spacing, along a transporting direction, in order to increase the throughput.

BRIEF DESCRIPTION OF THE DRAWINGS

Further advantageous features and embodiments are described below on the basis of exemplary embodiments and the figures, in which.

DETAILED DESCRIPTION

In the figures, schematic representations that are not to scale are shown.

Figure 1:
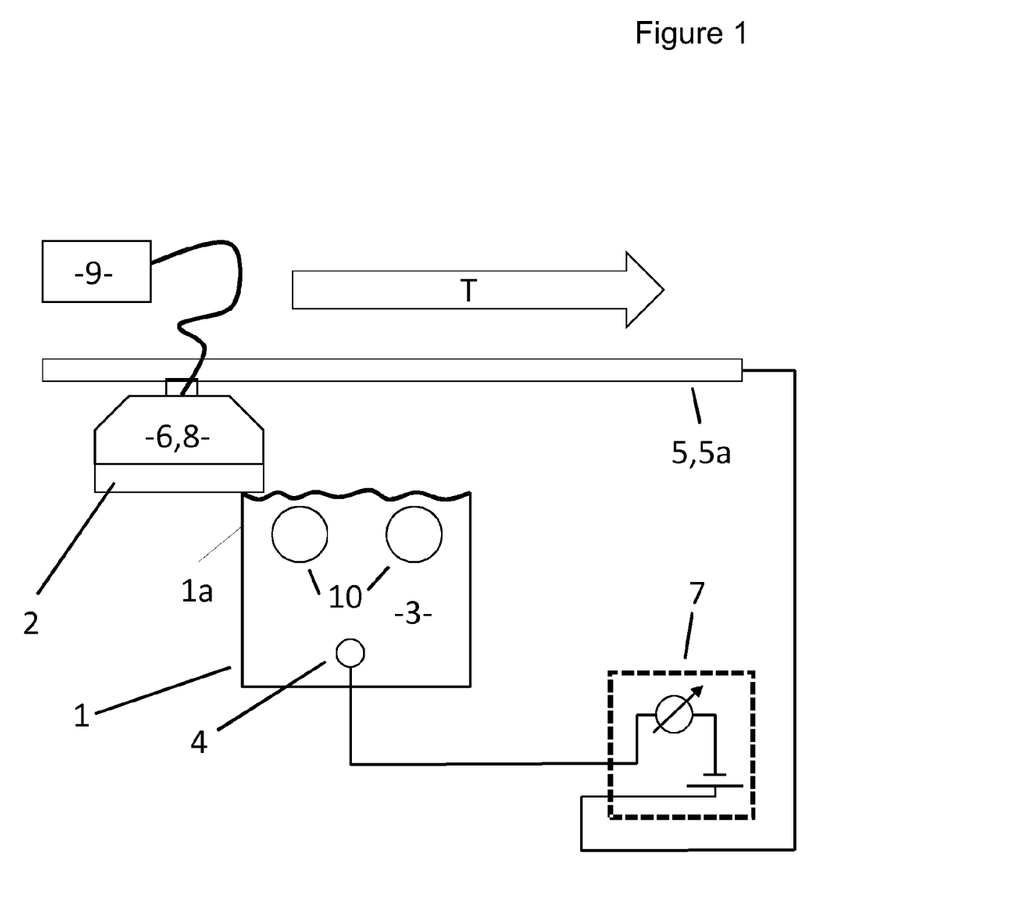
FIG. 1 shows a first exemplary embodiment of an apparatus according to the invention.

In FIG. 1, an exemplary embodiment of an apparatus for etching one side of a semiconductor layer of a workpiece is shown. The apparatus has an etching basin 1 and serves for etching one side of a workpiece 2 formed as a silicon wafer. The etching basin 1 is filled with electrolyte 3. In the etching basin, a first electrode 4 is arranged as a cathode. Above the etching basin 1 there is a transporting system 5. This comprises a transporting rail 5a with an integrated conveyor belt and also a negative-pressure holding element 6 that can be displaced linearly by the conveyor belt along the transporting rail 5a in the transporting direction T.

The apparatus also has a constant current source 7, which is connected in an electrically conducting manner on the one hand to the first electrode 4 and on the other hand to a contact rail, which is integrated in the guiding rail 5a of the transporting system.

The negative-pressure holding element 6 has a sliding contact, which is arranged in such a way that there is electrical contact of the sliding contact with respect to the contact rail of the transporting rail 5a, even while the negative-pressure holding element 6 is being moved in the transporting direction T.

The negative-pressure holding element 6 also has a second electrode, formed as an anode. This is arranged inside a housing of the negative-pressure holding element 6 in such a way that, when the workpiece 2 is arranged on the negative-pressure holding element 6, it is in electrically conducting surface-area contact with the holding side (the upper-lying side in the figure) of the workpiece 2.

Consequently, an etching current can be formed between the first electrode 4 and the second electrode 8 by the constant current source 7, in order to etch the workpiece 2 on the underlying side, facing the electrolyte 3, in the present case in order to achieve porosification on the etching side.

The transporting device formed as the transporting system 5 is consequently formed for transporting the workpiece 2 in relation to the etching basin 1 in such a way that only the etching side to be etched (the underlying side in the figure) of the workpiece, which in the present case is identical to the semiconductor layer, can be wetted by the electrolyte 3.

The apparatus is in this case formed in such a way that, during the etching operation, the workpiece 2 is held exclusively by the negative-pressure holding element 2. For this purpose, a negative pressure of 1000 Pa is generated by a negative pressure source 9 formed as a vacuum pump. The negative pressure source 9 is connected to the negative-pressure holding element 6 by way of a flexible hose, so that the workpiece 2 is held by the negative-pressure holding element 6 and pressed against the second electrode 8 by the negative pressure. The apparatus also has a safety transporting system 10, which in the present case is formed by a number of rollers rotating in the same direction. For reasons of overall clarity, only two rollers are shown. In an alternative embodiment, the safety transporting system has chains for conveying a fallen-off workpiece or fragments thereof.

The rollers are arranged at a small distance (in the present case 5 mm) below the surface of the electrolyte 3, so that there is no contact between the workpiece 2 and the rollers of the safety transporting system 10 during the etching operation. Should the workpiece 2 become detached from the negative-pressure holding element 6 because of a fault, in particular break up, the workpiece 2 or fragments thereof, if they are of a sufficient size and shape, is/are carried by the rollers 6 in the transporting direction to the edge of the etching basin 1 and pushed there over the edge, and consequently discharged.

Figure 2:
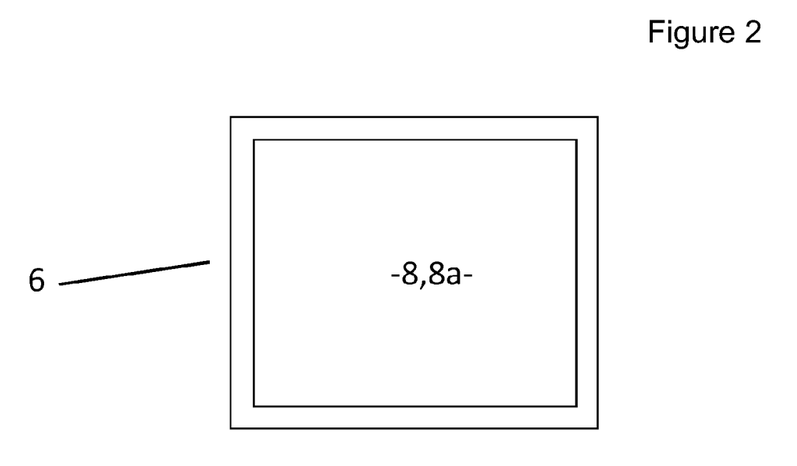
FIG. 2 shows a plan view from below of a negative-pressure holding element of the apparatus.

In FIG. 2, a plan view from below of the negative-pressure holding element 6 is shown. The negative-pressure holding element 6 has a kind of vacuum bell, which is open in the downward direction. In FIG. 2, therefore, the outer, peripheral edge of the negative-pressure holding element 6 can be seen in the plan view from below. This rests on the edge of the holding side of the workpiece 2. This element of the negative-pressure holding element that is formed in the manner of a vacuum bell is formed from an electrically non-conducting material, in the present case from plastic, for example PE, PP, PEEK, PTFE or PFA, and has on the side facing the workpiece 2 a peripheral edge seal, in the present case of Teflon, alternatively of Kalrez. As a result, an airtight termination between the negative-pressure holding element 6 and the edge of the workpiece 2 can be formed on the holding side. Arranged inside the element of the negative-pressure holding element that is formed in the manner of a vacuum bell is the second electrode 8, the construction of which is described more specifically in FIG. 3. In the plan view from below, a contact-forming element 8a can be seen, which in the present case is formed as a planar plate of graphite with a thickness of 10 mm.

In the present case, the contact-forming element 8a has a surface area of 13×13 cm². The workpiece has both on the side to be etched and on the holding side a surface area of 15.7×15.7 cm². When the workpiece 2 is arranged in a centered manner on the negative-pressure holding element 6, a peripheral edge of 1.35 cm is consequently obtained between the edge of the contact-forming element 8a and the edge of the holding side of the workpiece 2. As a result, leakage currents that may lead to an inhomogeneous etching operation are avoided in a particularly efficient way.

Figure 3:
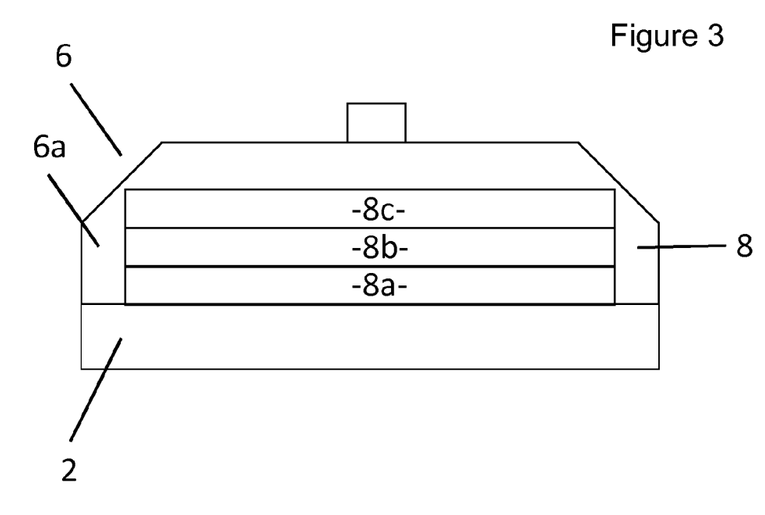
FIG. 3 shows a cross section through the negative-pressure holding element.

In FIG. 3, a cross section through the negative-pressure holding element 6 is shown. The cross section takes place parallel to the plane of the drawing according to FIG. 1. The negative-pressure holding element 6 has an outer housing, which—as previously described—is formed in the manner of a vacuum bell 6a. The vacuum bell 6a has on the upper side an opening for connecting to the negative pressure source 9. Inside the vacuum bell 6a, the second electrode 8 is arranged fixed in place on the vacuum bell 6a. The second electrode 8 has in the present case the previously described contact-forming element as a contact-forming structure 8a, a current distributing element 8b and a current supplying element 8c. The current supplying element is formed from copper and has a cable for connecting to the sliding contact, which contacts the current supplying rail on the transporting rail 5a. Alternatively, the current supplying element is formed from platinum or graphite. Furthermore, the current supplying element 8c comprises a copper plate, which has the aforementioned surface area of the contact-forming structure 8a. Arranged between the contact-forming structure 8a and the copper plate of the current supplying element 8c is a current distributing element 8b, which is formed as a graphite plate with a thickness of 10 mm and likewise has the surface area of the contact-forming structure 8a. A homogeneous supply of current to the contact-forming structure 8a is consequently ensured by this three-layered construction. In addition, it is ensured by the metal-free current distributing element 8b that the distributing element 8b is protected from corrosive vapors that are emitted from the etching region.

Figure 4:
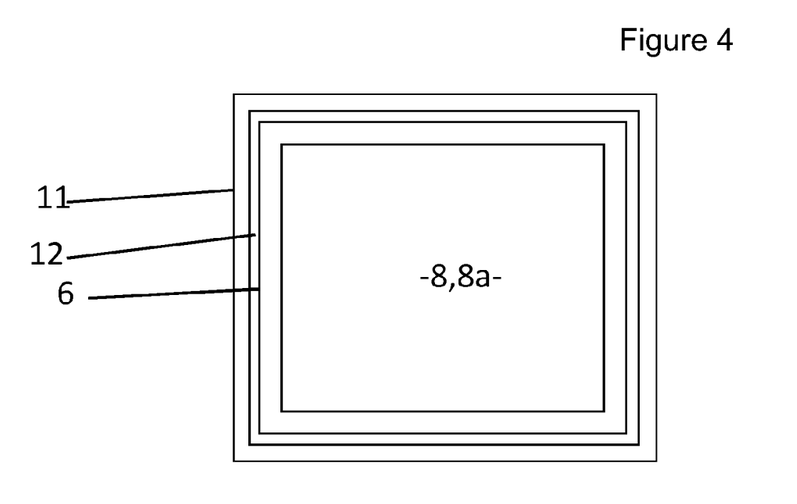
FIG. 4 shows a second exemplary embodiment with a lateral extension of the negative-pressure holding element by a barrier gas device.
Figure 5:
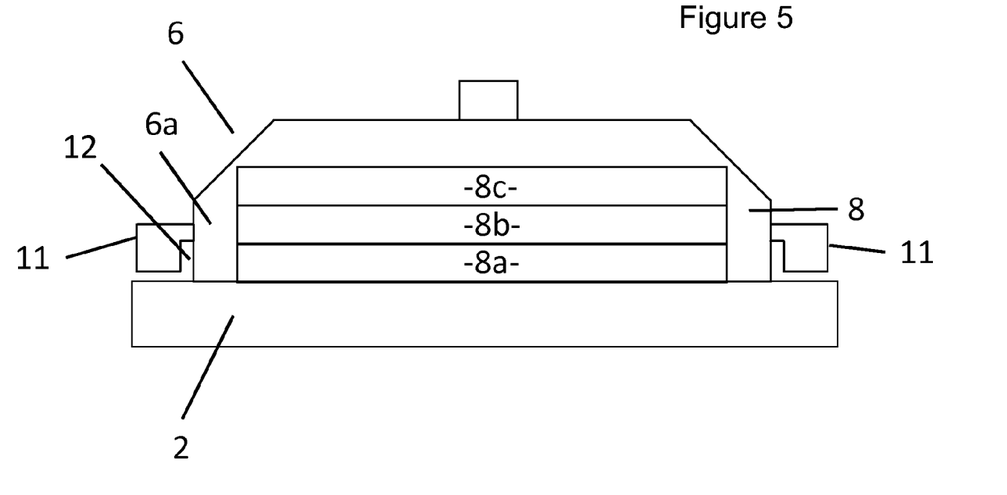
FIG. 5 shows a cross section through the negative-pressure holding element according to FIG. 4.

Shown in FIGS. 4 and 5 is a second exemplary embodiment of an apparatus according to the invention that has a lateral extension of the negative-pressure holding element by a barrier gas device. In principle, the apparatus is constructed in a way analogous to the first exemplary embodiment. Therefore, to avoid repetition, only the essential differences are explained below:

The negative-pressure holding element 8 additionally has a barrier gas device 11, which is formed peripherally around the edge of the negative-pressure holding element 6. In particular, formed in the barrier gas device 11 is a barrier-gas distributing channel 12, which runs peripherally around an edge of the negative-pressure holding element 6 that contacts the workpiece 2. The peripheral form is shown in the plan view from below of the negative-pressure holding element 6 according to FIG. 4. FIG. 4 consequently shows a view corresponding to FIG. 2.

Correspondingly, FIG. 5 shows a section through the negative-pressure holding element 6 according to the second exemplary embodiment. The view according to FIG. 5 consequently corresponds to the representation according to FIG. 3.

The workpiece 6 has at the outer edge the barrier gas device 11, with the barrier-gas distributing channel 12. Inside the peripheral barrier-gas distributing channel 12, the negative-pressure holding element 6 is in contact with the workpiece 2, in order to form a negative pressure. The barrier-gas distributing channel 12 is consequently formed peripherally around the vacuum bell 6a of the negative-pressure holding element 6. As can be seen in FIG. 5, the barrier gas device 11 does not contact the workpiece 2, but instead is kept at a distance from it, in order to form a barrier-gas outlet channel. If barrier gas, in the present case ambient air (the use of inert gas, such as for example nitrogen or argon, is similarly possible), is then directed into the barrier-gas distributing channel, the barrier gas escapes laterally to the outside. As a result, penetration of electrolyte is avoided, or at least considerably reduced, and consequently the risk of electrolyte penetrating into the contact surface between the contact-forming structure 8a and the workpiece 2 is likewise reduced considerably.

The negative-pressure holding element 6 therefore additionally has at the upper edge a connection for supplying the barrier gas, which is connected in a fluid-conducting manner to the barrier-gas distributing channel 12. The apparatus has a barrier gas source, in particular a fan, which is connected in a fluid-conducting manner to the barrier-gas supply connection.

The gas flow of the barrier gas is preferably at least 1 cm³/minute. In particular, the gas flow is preferably in the range of 1 cm³/min to 100 l/min.

Preferably, a positive pressure in the range of 1 Pa to 5000 Pa is generated in the barrier-gas distributing channel by the barrier gas.

Figure 6:
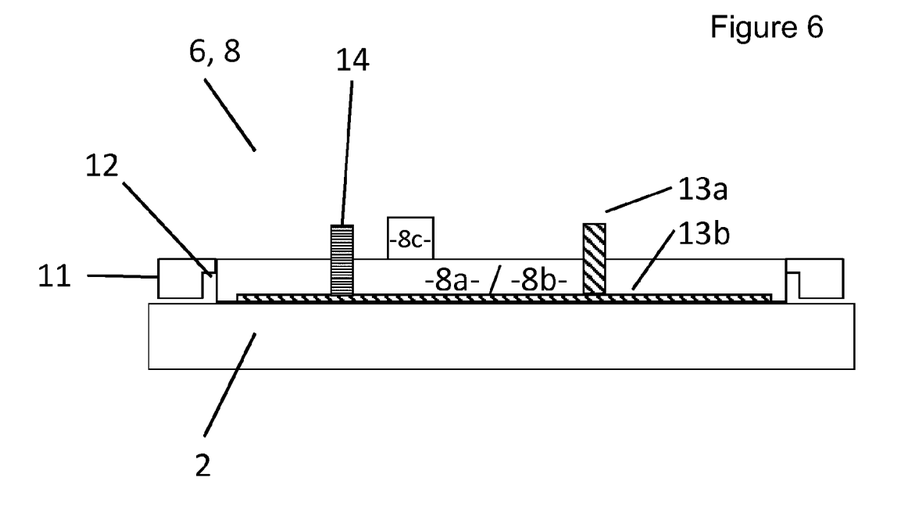
FIG. 6 shows an exemplary embodiment of a negative-pressure holding element in which the functions of the contact-forming structure, the current distributing element, parts of the current supplying element and also of the negative-pressure holding element are combined in a monolithic construction.

In FIG. 6, a further exemplary embodiment of a negative-pressure holding element 6 is shown.

In this exemplary embodiment, the function of the contact-forming structure, the current distributing element and also parts of the current supplying element and of the negative-pressure holding element is combined in a monolithic construction:

By use of a graphite plate with a thickness of 1 cm, the contact-forming structure 8a and the current distributing element 8b are formed: the graphite plate has a negative pressure connection 13a, which are formed in a fluid-conducting manner with negative-pressure distributing channels 13b on the side of the negative-pressure holding element 6 that is facing the workpiece 2. The negative pressure connection 13a is connected in a fluid-conducting manner to the negative pressure source 9.

Arranged on the side of the graphite plate that is facing away from the workpiece 2 is the current guiding element 8c. This has a smaller surface area than the current distributing element 8b. It may be chosen such that the graphite plate has a sufficient thickness, and consequently sufficient electrical transverse conducting properties, to achieve a homogeneous etching current.

The negative-pressure distributing channels 13b merely form a small part of the surface area of the graphite plate that is facing the workpiece 2: approximately 10% of the contact surface is formed as structured with negative-pressure distributing channels. The remaining contact surface serves for the surface-area contacting of the workpiece 2.

Formed at the edge of the graphite plate is a barrier gas device 11 with a barrier-gas distributing channel 12, which is formed and connected in a way analogous to the second exemplary embodiment.

The negative-pressure holding element 6 according to FIG. 6 is likewise used in an apparatus such as that described in relation to FIG. 1 and the first exemplary embodiment. As also in the case of the second exemplary embodiment, the apparatus additionally has a fan for supplying barrier gas.

The negative-pressure holding element 6 also has a flushing gas device 14. This is connected in a fluid-conducting manner to the negative-pressure connection 13a, in particular the negative-pressure distributing channels 13b.

Figure 7:
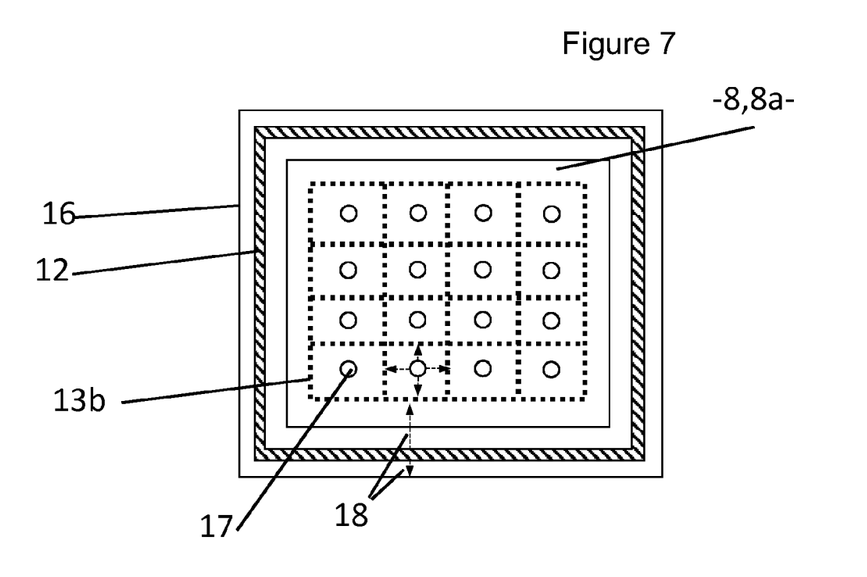
FIG. 7 shows an exemplary embodiment of a negative-pressure holding element with flushing-gas outlet openings, negative-pressure distributing channels and a barrier gas device in plan view from below.

In FIG. 7, a further exemplary embodiment of a negative-pressure holding element is shown in plan view from below: the construction corresponds to the construction according to FIG. 4, but the contact surface of the contact-forming structure 8a has a plurality of flushing-gas outlet openings 17, which are connected in a fluid-conducting manner to a flushing-gas supply inlet. Furthermore, the contact-forming structure has negative-pressure distributing channels 13b, which are connected in a fluid-conducting manner to the negative pressure source 9 in order to press and hold the workpiece 2 against the negative-pressure holding element 6 by negative pressure. The barrier gas is distributed in a way corresponding to the direction of gas flow 18 through the gap between the barrier gas device 11 and the workpiece 2 to the outside and also into the negative-pressure distributing channels 13b.

In a further advantageous exemplary embodiment, the negative-pressure holding element according to FIG. 6 is formed in a way analogous to the view and description relating to FIG. 7 and the flushing gas device 14 is connected in a fluid-conducting manner to the flushing-gas outlet openings 17: when a workpiece 2 is already arranged on the negative-pressure holding element 6, cleaning of the contact surface takes place as follows: while it is being sucked into place, a flushing gas (in the present case air; an inert gas, such as for example nitrogen or argon, is similarly within the scope of the invention) is directed by the flushing gas device 14 through the flushing-gas outlet openings 17 and also preferably through the barrier gas inlet 17 of the contact surface between 8a and the workpiece 2. The supply is dimensioned in such a way that the flushing gas is sucked away by the negative pressure source 9, via the negative-pressure distributing channels 13b, and in addition a negative pressure is maintained, so that the workpiece 2 stays arranged on the negative-pressure holding element 6. Here, the flushing gas flows along the suction side according to directions defined by the arrows (18). In this way, foreign particles can be sucked away via the negative pressure connection 13a.

Figure 8:
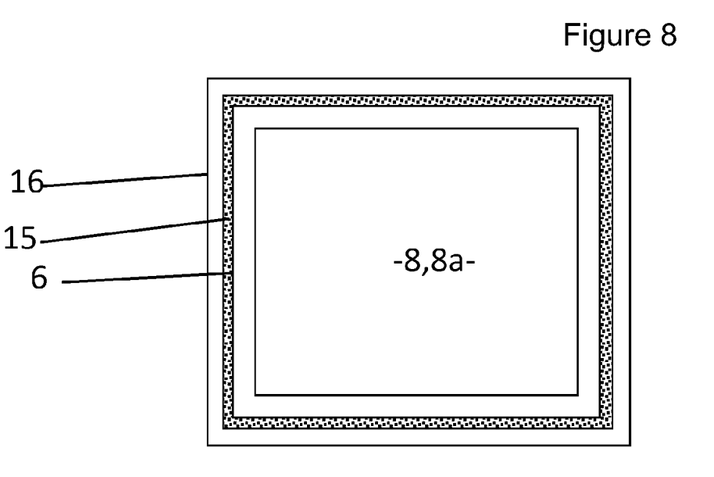
FIG. 8 shows an alternative exemplary embodiment of a negative-pressure holding element with a sealing ring in plan view from below.

In FIG. 8, a further exemplary embodiment of a negative-pressure holding element is shown, having a sealing ring as a sealing element: in FIG. 8, an alternative to the negative-pressure holding element 6 represented in FIGS. 4 and 5 is shown. This negative-pressure holding element does not have a barrier gas device as a sealing element, as shown in FIGS. 4 and 5, but instead a sealing ring 15, which is formed peripherally around the region of the negative-pressure holding element 6 that contacts the workpiece 2 and is held by a mounting frame 16 for the sealing ring.

LIST OF REFERENCE SIGNS

1 Etching basin
2 Workpiece
3 Electrolyte
4 First electrode
5 Transporting system
5a Transporting rail
6 Negative-pressure holding element
6a Vacuum bell
7 Constant current source
8 Second electrode
8a Contact-forming structure
8b Current distributing element
8c Current supplying element
9 Negative pressure source
10 Safety transporting system
11 Barrier gas device
12 Barrier-gas distributing channel
13a Negative pressure connection
13b Negative-pressure distributing channels
14 Flushing gas device
15 Sealing element
16 Mounting frame for sealing element
17 Flushing-gas outlet opening
18 Direction of flow of the barrier gas

The invention claimed is:

1. An apparatus for etching one side of a semiconductor layer of a workpiece, the apparatus comprising:
   at least one etching basin (1) for receiving an electrolyte,
   a first electrode arranged to electrically contact the electrolyte that is located in the etching basin (1) during use,
   at least one second electrode arranged to directly or indirectly electrically contact the semiconductor layer,
   at least one electrical current source connected in an electrically conducting manner to the first and second electrodes for generating an etching current,
   at least one transporting device configured to transport the workpiece in relation to the etching basin (1) such that an etching side to be etched of the semiconductor layer is wetted by the electrolyte that is located in the etching basin (1) during use,
   the transporting device has a negative-pressure holding element (6) for the workpiece (2), the negative-pressure holding element (6) is formed for arranging the workpiece on a holding side of the workpiece opposite from the etching side by negative pressure, and
   the second electrode (8) is arranged on the negative-pressure holding element (6) such that, when a workpiece (2) is arranged on the negative-pressure holding element (6), contacting of the holding side of the workpiece takes place by the second electrode.

2. The apparatus as claimed in claim 1, wherein the apparatus is configured to hold the workpiece (2) exclusively by the negative-pressure holding element during transport of the workpiece in relation to the etching basin (1) such that the etching side to be etched of the semiconductor layer is wetted by the electrolyte that is located in the etching basin.

3. The apparatus as claimed in claim 1, further comprising a safety transporting system having at least one catching element, and the safety transporting system is configured to move the catching element in the electrolyte synchronously with the negative-pressure holding element during transport of the workpiece in relation to the etching basin (1) such that the etching side to be etched of the semiconductor layer is wetted by the electrolyte that is located in the etching basin.

4. The apparatus as claimed in claim 3, wherein the transporting system (5) and the safety transporting system are configured such that there is no contact between the workpiece (2) and the catching element during transport of the workpiece in relation to the etching basin (1) such that the etching side to be etched of the semiconductor layer is wetted by the electrolyte that is located in the etching basin.

5. The apparatus as claimed in claim 1, further comprising a negative pressure source (9) that interacts with the negative-pressure holding element (6), in order to generate a pressing pressure of the workpiece against the second electrode (8) in a range of 10 Pa to 500 mbar.

6. The apparatus as claimed in claim 1, wherein the second electrode (8) is formed as a flat electrode for covering a surface area of at least 100 cm$^2$ of the holding side of the workpiece.

7. The apparatus as claimed in claim 1, wherein the second electrode (8) has a metallic current supplying element (8c), a metal-free current distributing element (8b) and a contact-forming structure (8a), which are arranged such that, when the workpiece (2) is arranged on the negative-pressure holding element (6), the holding side of the workpiece lies against the contact-forming structure and the contact-forming structure (8a) is connected in an electrically conducting manner to the metallic current supplying element (8c) by the metal-free current distributing element (8b).

8. The apparatus as claimed in claim 7, wherein the metal-free current distributing element (8b) covers in an electrically conducting manner at least 80% of the surface area of the contact-forming structure that is assigned to the current distributing element (8b).

9. The apparatus as claimed in claim 8, wherein the contact-forming structure (8a) is formed as at least one of a rigid plate, a soft woven fabric, a pin cushion, an element spring-mounted on the negative-pressure holding element (6) or with a structured contact side.

10. The apparatus as claimed in claim 7, wherein at least the current distributing element (8b) and the contact-forming structure (8a) are formed in one piece.

11. The apparatus as claimed in claim 1, wherein the negative-pressure holding element has at least one sealing element configured to reduce a risk of penetration of electrolyte into the contact surface between the second electrode and the workpiece when the workpiece is arranged on the negative-pressure holding element.

12. The apparatus as claimed in claim 11, wherein the sealing element includes a barrier gas device (11) formed to reduce the risk of penetration of electrolyte into the contact surface between the second electrode (8) and the workpiece (2) by a flow of barrier gas.

13. The apparatus as claimed in claim 1, further comprising a flushing gas device (14) configured to flush off the contact surface between the workpiece (2) and the second electrode (8) at least one of before or during at least one of a sucking-into-place operation or transport of the workpiece in relation to the etching basin (1) such that the etching side to be etched of the semiconductor layer is wetted by the electrolyte that is located in the etching basin.

14. A method for etching one side of a semiconductor layer of a workpiece using the apparatus as claimed in claim 1, the method comprising:
   wetting the semiconductor layer being wetted with the electrolyte on the etching side to be etched,
   electrically contacting the electrolyte (3) by the first electrode and the workpiece (2) being electrically contacted on the holding side facing away from the electrolyte (3) by the second electrode,
   forming an etching current being formed between the electrodes,
   during an etching operation when the semiconductor layer is being wetted with the electrolyte on the etching side, holding and pressing the workpiece (2) by negative pressure against the second electrode (8) exclusively on the holding side opposite from the etching side.

15. The method as claimed in claim 14, wherein the workpiece (2) is pressed against the second electrode (8) by negative pressure with a pressure in a range of 10 Pa to 50,000 Pa.

16. The method as claimed in claim 14, wherein the second electrode (8) makes dry contact with the holding side of the workpiece during the etching operation.

17. The method as claimed in claim 14, wherein the second electrode (8) contacts a surface area of at least 80% of the holding side of the workpiece during the etching operation.

18. The method as claimed in claim 14, wherein the second electrode (8) contacts the holding side of the workpiece at a distance from an edge in a range of 5 mm to 20 mm from the edge of the workpiece.

19. The method as claimed in claim 14, further comprising creating a porous layer on the etching side by the etching operation.

20. The method as claimed in claim 14, further comprising, parallel to a sucking-into-place of the workpiece (2) by negative pressure, keeping the etching medium away from the contact-forming electrode by a barrier gas applied to an edge of the workpiece (2) on the surface contacted by the second electrode.

21. The method as claimed in claim 14, further comprising transporting an upper edge of the workpiece below a level of the electrolyte.

* * * * *